(12) United States Patent
Shiode

(10) Patent No.: US 7,499,179 B2
(45) Date of Patent: Mar. 3, 2009

(54) MEASUREMENT METHOD AND APPARATUS, EXPOSURE APPARATUS, EXPOSURE METHOD, AND ADJUSTING METHOD

(75) Inventor: Yoshihiro Shiode, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 228 days.

(21) Appl. No.: 11/694,402

(22) Filed: Mar. 30, 2007

(65) Prior Publication Data

US 2007/0229803 A1      Oct. 4, 2007

(30) Foreign Application Priority Data

Mar. 30, 2006  (JP) .............................. 2006-096053
Mar. 28, 2007  (JP) .............................. 2007-086006

(51) Int. Cl.
    *G01B 11/14*   (2006.01)
(52) U.S. Cl. ....................................... 356/496; 356/614
(58) Field of Classification Search ................ 356/124, 356/496, 498, 521, 614, 615
    See application file for complete search history.

(56) References Cited

U.S. PATENT DOCUMENTS

| | | | |
|---|---|---|---|
| 3,797,939 A * | 3/1974 | Pryor | ......................... 356/505 |
| 3,937,580 A * | 2/1976 | Kasdan | ......................... 356/496 |
| 4,854,707 A | 8/1989 | Ring et al. | |
| 4,931,830 A * | 6/1990 | Suwa et al. | .................... 355/53 |
| 6,040,894 A | 3/2000 | Takahashi | |
| 6,956,640 B2 * | 10/2005 | Lee | ............................. 355/53 |

FOREIGN PATENT DOCUMENTS

| | | |
|---|---|---|
| EP | 1184727 | 3/2002 |
| JP | 03-065623 | 3/1991 |
| JP | 2004226372 A * | 8/2004 |
| JP | 2005-322856 | 11/2005 |

OTHER PUBLICATIONS

European Patent Office Action dated Jul. 22, 2008 concerning application No. 7006753.3-1226.
European Search Report issued on Jul. 11, 2007 for European counterpart application No. 07006753.3-1226.

* cited by examiner

*Primary Examiner*—Samuel A Turner
(74) *Attorney, Agent, or Firm*—Morgan & Finnegan LLP

(57) ABSTRACT

A measurement method for measuring a position of an aperture stop in an optical system includes the steps of measuring a light intensity distribution of light that passes the aperture stop, at a position that is optically conjugate with a pupil position in the optical system, and determining a position of the aperture stop in the optical system based on a diffraction fringe of the light intensity distribution measured by the measuring step.

11 Claims, 11 Drawing Sheets

130

140

MEASUREMENT METHOD AND APPARATUS, EXPOSURE APPARATUS, EXPOSURE METHOD, AND ADJUSTING METHOD

BACKGROUND OF THE INVENTION

1. Field of the Invention

The present invention relates to a measurement method and apparatus used to measure a numerical aperture ("NA") of a projection optical system in an exposure apparatus.

2. Description of the Related Art

A conventional projection exposure apparatus projects a circuit pattern of a reticle (mask) onto a wafer or another substrate via a projection optical system in manufacturing fine semiconductor devices, such as a semiconductor memory and a logic circuit, using the photolithography technology.

The minimum critical dimension or a resolution transferable by the projection exposure apparatus is proportionate to a wavelength of the light used for exposure, and inversely proportionate to the NA of the projection optical system. The shorter the wavelength is and the higher the NA is, the smaller the resolution is. Along with the recent demands for fine processing to a semiconductor device, use of a short wavelength of the exposure light and a high NA scheme of the projection optical system are promoted. In particular, as the high NA scheme of the projection optical system proceeds, the NA matching in the exposure apparatus is important, and a highly precise NA measurement and adjustment of the projection optical system (an aperture shape and position of an aperture stop in the projection optical system) are increasingly demanded.

Conventionally, there are proposed some measurement methods of the NA of the projection optical system. Japanese Patent Laid-Open No. ("JP") 3-65623 measures a luminance or light intensity distribution at the aperture stop position based on the light that has passed the aperture stop in the projection optical system, and calculates the NA of the projection optical system from the luminous or light intensity distribution measurement result. More specifically, as in the measurement method of JP 2005-322856, noises are removed from the light intensity distribution which is measured through integrations and smoothing, and the light intensity distribution is smoothed. The NA of the projection optical system is calculated from a local minimum value in a differential light intensity distribution curve that is derived from a differential process to the smoothed light intensity distribution.

Both JP 03-65623 and the measurement method of JP 2005-322856 are silent about the influence of the diffracted light generated from the aperture stop's edge in the projection optical system, on the light intensity distribution. When there are plural local minimum values in the differential light intensity distribution curve or plural inflection points in the measured light intensity distribution, JP 2005-322856 does not specify which inflection point corresponds to the NA of the projection optical system or whether the inflection point precisely corresponds to the NA of the projection optical system.

When the light is irradiated onto the aperture stop, the light that has passed the aperture stop and the light that has been diffracted at the aperture stop's edge interfere with each other. It is thus assumed that the light intensity distribution just after the aperture stop is the light intensity distribution that contains a diffraction fringe having a periodic relief pattern near the edge. The differential light intensity distribution curve derived from such a light intensity distribution has plural local minimum and maximum values. It is assumed that the measurement method of JP 2005-322856 detects the local minimum value in the differential light intensity distribution curve after smoothing the diffraction fringe as noises. Since the diffraction fringe provides information from the aperture stop's edge, the measurement method of JP 2005-322856 that smoothes the diffraction fringe as noises cannot precisely measure the NA of the projection optical system (aperture stop's aperture shape and position).

BRIEF SUMMARY OF THE INVENTION

The present invention is directed to a measurement method and apparatus that can precisely measure a position of an aperture stop in an optical system.

A measurement method according to one aspect of the present invention for measuring a position of an aperture stop in an optical system includes the steps of measuring a light intensity distribution of light that passes the aperture stop, at a position that is optically conjugate with a pupil position in the optical system, and determining a position of the aperture stop in the optical system based on a diffraction fringe of the light intensity distribution measured by the measuring step.

Further features of the present invention will become apparent from the following description of exemplary embodiments with reference to the attached drawings.

DESCRIPTION OF THE EMBODIMENTS

Figure 1:
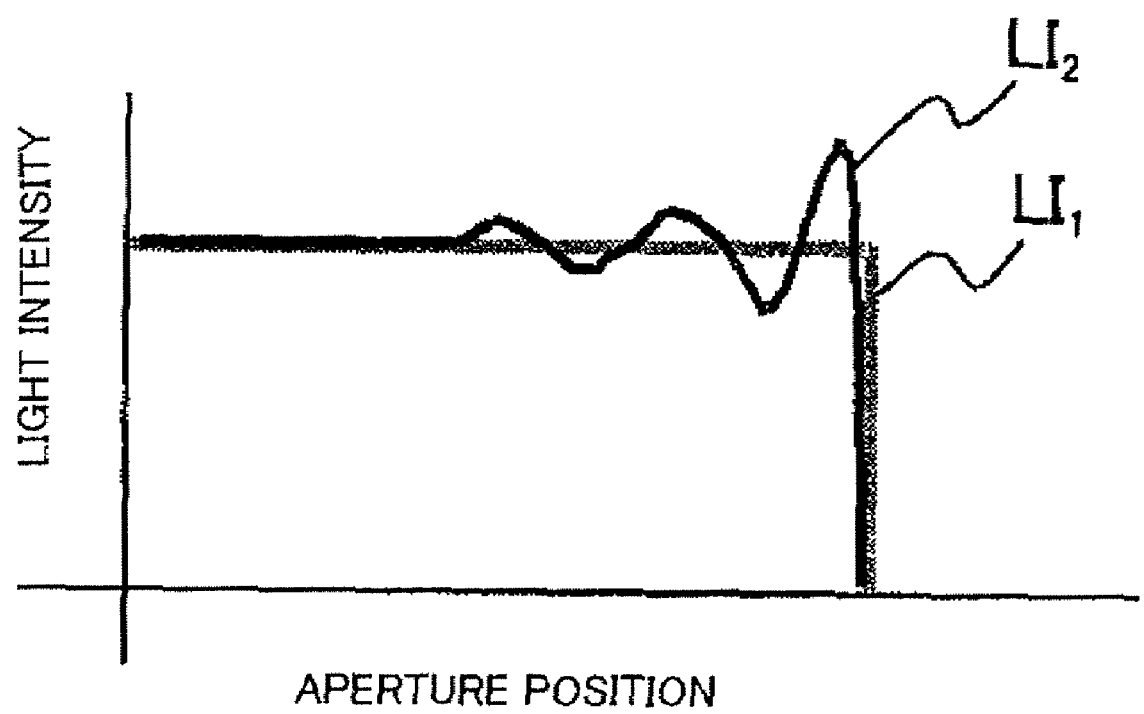
FIG. 1 shows a light intensity distribution at an aperture stop's edge.

Referring now to the accompanying drawings, a description will be given of an exposure apparatus according to one aspect of the present invention. In each figure, the same reference numeral designates the same element, and a duplicate description thereof will be omitted.

The instant inventor has recognized that the diffraction fringe included in the light intensity distribution contains information from the edge of the aperture stop, and discovered that the NA of the projection optical system can be precisely measured by utilizing a relationship between the diffraction fringe and an aperture stop edge position.

The Maxwell equation gives the diffraction phenomenon from the aperture stop's edge. Referring to FIG. 1, it is known that a light intensity distribution $LI_2$ that contains a diffraction fringe is a rigorous solution led from the Maxwell equation applied to a rectangular light intensity distribution $LI_1$ that is formed by an aperture part and a light shielding part of the aperture stop's edge that receives a plane wave. Here, FIG. 1 shows a light intensity distribution at the aperture stop's edge, in which an abscissa axis denotes an aperture position, and an ordinate axis denotes a light intensity.

With the light intensity distribution $LI_2$ (or rigorous solution), the light amplitude information on the image plane is available, and the aperture stop position or aperture position can be calculated by reversely propagating the light amplitude information. When a table previously stores a relationship between the aperture stop position and the light amplitude information or light intensity distribution, and when the actual light amplitude information or light intensity distribution is compared with the table, the aperture stop position is available. Approximately, the aperture stop position can be easily calculated from the diffraction fringe of the light intensity distribution.

The present invention is directed to a method of determining the aperture stop position from the diffraction fringe in the light intensity distribution. However, as discussed above, the present invention covers a method of determining the aperture stop position by making a table or template about the previously calculated diffraction fringe of the light intensity distribution based on the rigorous solution, and by comparing it with the actual light intensity distribution.

Figure 2:
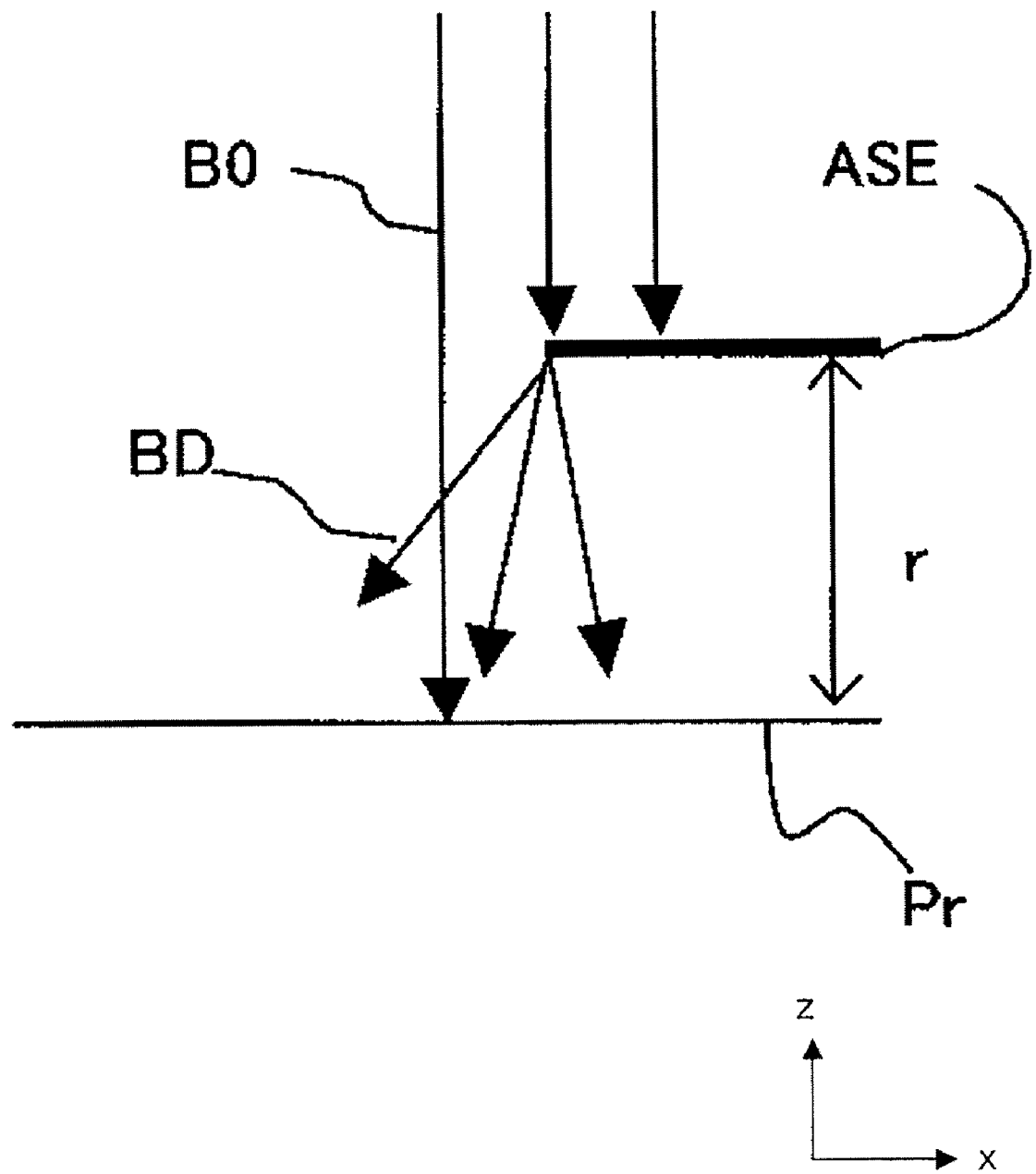
FIG. 2 illustrates diffraction at the aperture stop's edge.

A description will now be given of a method for approximately calculating the aperture stop position. As shown in FIG. 2, the light intensity distribution at a position Pr that is distant from an aperture stop edge ASE by a distance r contains a diffraction fringe due to the interference between a ray B0 and a diffracted ray BD. A phase of the diffracted ray BD retards by $5/4\pi$ relative to a phase of the ray B0. FIG. 2 illustrates diffraction at the aperture stop edge ASE.

Equations 1 and 2 below give ΔXmax and ΔXmin that provide a local maximum value and a local minimum value of a diffracted image between the ray B0 and the diffracted ray BD at the position Pr, and are calculated with the Fresnel approximation. Here, ΔXmax and ΔXmin are shifts in the X direction from the true position of the aperture stop edge ASE. When a distance r between the edge ASE and the position Pr approaches 0, a distance between ΔXmax and ΔXmin, which provide a local maximum value and a local minimum value, approaches 0 and does not actually exist. However, this is due to use of the Fresnel approximation, and an extreme value actually exists like the rigorous solution $LI_2$. This embodiment discusses the distance r that falls within the Fresnel approximation region.

$$\Delta X\max(n) = \sqrt{(3/4+2n)\cdot(\lambda\cdot r)} \quad \text{Equation 1}$$

$$\Delta X\min(n) = \sqrt{(7/4+2n)\cdot(\lambda\cdot r)} \quad \text{Equation 2}$$

A precise position of the aperture stop edge ADE or the distance r from the aperture stop position to the position Pr as a measurement position can be calculated by specifying a position X that provides a periodic local maximum or minimum value in the light intensity distribution that is formed by the light that passes the aperture stop. The position Pr is a difference between the aperture stop position and the pupil plane of the projection optical system, and enables a positional offset of the aperture stop to be measured in the optical axis direction or the Z direction.

A description will now be given of various exposure apparatuses that utilize the above principle.

First Embodiment

Figure 3:
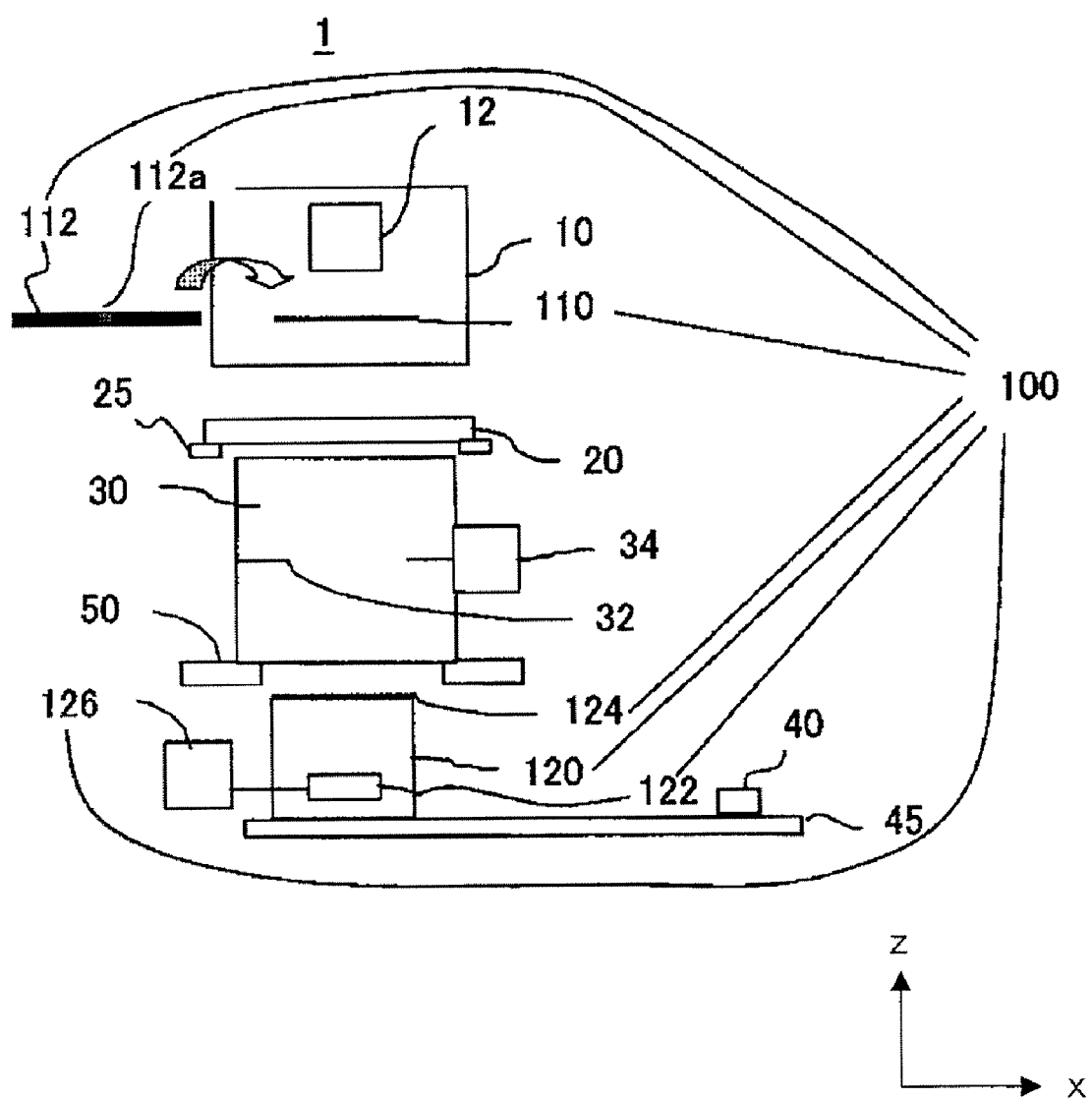
FIG. 3 is a schematic sectional view showing a structure of an exposure apparatus according to one aspect of the present invention.

FIG. 3 is a schematic sectional view showing a structure of the exposure apparatus 1 according to one embodiment of the present invention. The exposure apparatus 1 is a projection exposure apparatus that exposes a circuit pattern of the reticle 20 onto the substrate 40. The exposure apparatus 1 uses a step-and-scan exposure manner to expose the wafer 40. However, the exposure apparatus 1 can use a step-and-repeat manner.

The exposure apparatus 1 includes, as shown in FIG. 3, an illumination apparatus 10, a reticle stage 25 mounted with a reticle 20, a projection optical system 30, a wafer stage 45 mounted with a substrate 40, a focus measuring system 50, and a measurement unit 100.

The illumination apparatus 10 illuminates the reticle 20 that has a circuit pattern to be transferred, and includes a light source 12 and an illumination optical system (not shown).

The light source 12 uses an ArF excimer laser with a wavelength of approximately 193 nm. However, the light source 12 may use a KrF excimer laser with a wavelength of approximately 243 nm, and an $F_2$ laser with a wavelength of approximately 157 nm. The number of lasers is not limited. The type of the light source is not also limited. The illumination optical system (not shown) is an optical system that illuminates the reticle 20, and includes a lens, a mirror, an optical integrator, and a stop.

The reticle 20 has a circuit pattern to be transferred, and is supported on and driven by the reticle stage 25.

The reticle stage 25 supports the reticle 20, and is connected to a moving mechanism (not shown).

The projection optical system 30 images the pattern of the reticle 20 onto the substrate (wafer) 40. The projection optical system 30 can use a dioptric, catadioptric, or catoptric system.

The projection optical system 30 of this embodiment includes an aperture stop 32, and a driving mechanism 34. The aperture stop 32 is arranged at a pupil position in the projection optical system 30, and defines the NA of the projection optical system 30. The driving mechanism 34 serves as an adjusting unit that adjusts the aperture stop 32, and particularly adjusts or modifies and corrects an aperture shape and position of the aperture stop 32.

The substrate 40 is a wafer in this embodiment, but broadly covers a glass plate and another substrate. A photoresist is applied to the surface of the wafer 40.

The wafer stage 45 supports the substrate 40 via a wafer chuck (not shown).

The focus measuring system 50 measures a focal position of the substrate 40 plane in the Z direction or optical axis direction, and controls a position and angle of the wafer stage 45.

The measurement unit 100 measures a position of the aperture stop 32 in the projection optical system 30. The measurement unit 100 can also measure the aperture shape of the aperture stop 32 and the NA defined by the aperture stop 32. The measurement unit 100 of this embodiment includes an aperture plate 110, and a measuring part 120

The aperture plate 110 is located at a position that is optically conjugate with the object plane of the projection optical system 30, and housed in the illumination apparatus 10 in this embodiment. The aperture plate 110 enlarges the light from the light source 12 (NA of the illumination apparatus 10) to the aperture size of the aperture stop 32 in the projection optical system 30. Unless the aperture plate 110 can increase the NA of the illumination apparatus 10 up to the size of the aperture stop 32 in the projection optical system 30, or unless the light having a sufficient intensity is irradiated onto the edge of the aperture stop 32 in the projection optical system 30, the aperture plate 110 is replaced with an aperture plate 112 having an optical element 112a having a diffusion effect. The aperture plate 110 may be replaced with a mask having an aperture located at or near the object plane of the projection optical system 30.

The measuring part 120 is located on the wafer stage 45 in this embodiment, or on the image plane of the projection optical system 30 so that it is replaceable with the substrate 40. In exposing the substrate 40, the substrate 40 is located on the image plane of the projection optical system 30. In measuring the position of the aperture stop 32 in the projection optical system 30, the measuring part 120 is located on the image plane of the projection optical system 30. The measuring part 120 includes a CCD 122, an aperture plate 124, and a controller 126.

In measuring the position of the aperture stop 32 in the projection optical system 30, the light emitted from the illumination apparatus 10 passes the aperture stop 32 in the projection optical system 30, and enters the measuring part 120 via a relay optical system (not shown). The light incident upon the measuring part 120 forms the light intensity distribution on the CCD 122 arranged at a position optically conjugate with the pupil plane in the projection optical system 30. The position optically conjugate with the pupil plane in the projection optical system 30, as used herein, covers a substantially conjugate position, such as a far field. The aperture plate 124 is located above the CCD 122 so that the aperture plate 124 accord with the image plane of the projection optical system 30.

The controller 126 calculates a light intensity distribution of the entire pupil plane (which is referred to as a "light intensity distribution map" hereinafter) in the projection optical system 30 by using a measurement result by the CCD 122 (or the light intensity distribution), and analyzes the aperture stop 32 in the projection optical system 30 using the light intensity distribution map. The controller 126 also controls the aperture shape and position of the aperture stop 32 via the driving mechanism 34 based on the analysis result of the aperture stop 32 in the projection optical system 30.

Figure 4:
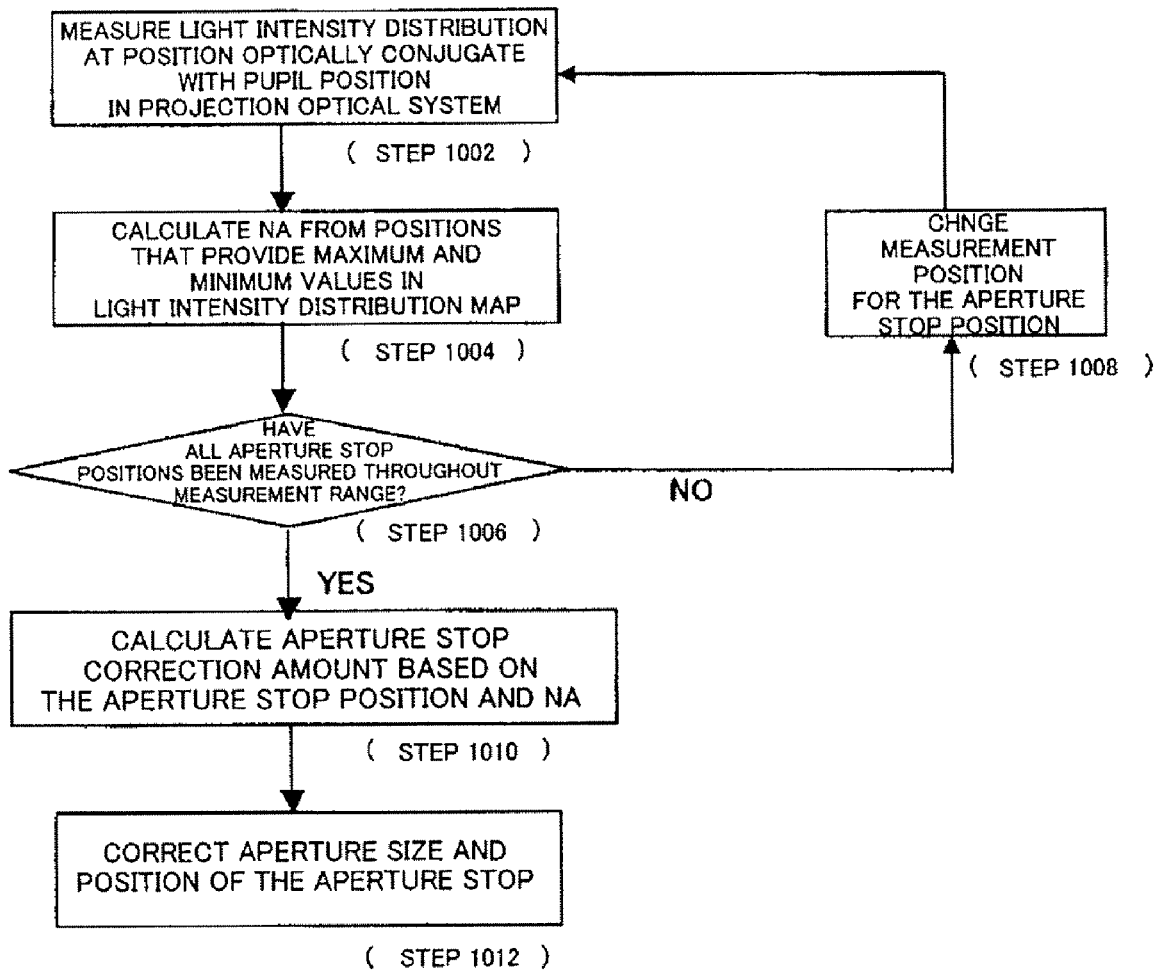
FIG. 4 is a flowchart for explaining a measurement method according to one aspect of the present invention.

Referring now to FIG. 4, a description will be given of control over the aperture stop 32 in the projection optical system 30 in one illustrative operation of the controller 126. In this embodiment, the controller 126 illustratively calculates the NA of the projection optical system 30 or the aperture size of the aperture stop 32. Here, FIG. 4 is a flowchart for explaining one illustrative operation of the controller 126 or the measurement method according to one aspect of the present invention.

Referring to FIG. 4, the CCD 122 measures, via the aperture plate 124, a light intensity distribution of the light that has passed the aperture stop 32 in the projection optical system 30, or measures the light intensity at a position that is optically conjugate with the pupil position of the projection optical system 30 (step 1002). The controller 126 calculates the light intensity distribution map from the light intensity distribution measured by the CCD 122, as discussed above.

Next, the NA of the projection optical system 30 (or the aperture size of the aperture stop 32) is calculated from positions that provide local maximum and minimum values in the calculated light intensity distribution map (step 1004). The NA of the projection optical system 30 is an average aperture size calculated by regarding the aperture shape of the aperture stop 32 as the true circle. In calculating the average NA in the radial direction, a polar coordinate is assumed with an origin at the center of outline of the light intensity distribution map. An average integral curve in the radial direction is obtained through integration in the rotating direction. The positions of the aperture stop 32 which provide local maximum and minimum values of the diffracted image can be calculated from the integral curve. Equations 3 and 4 below give calculated positions Xmax(n) and Xmin(n) of the aperture stop 32, where X0 is a true edge position of the aperture stop 32.

$$X\max(n)=X0-\Delta X\max(n) \quad \text{Equation 3}$$

$$X\min(n)=X0-\Delta X\min(n) \quad \text{Equation 4}$$

Equation 5 below can be obtained from Equations 1 and 3:

$$X\max(n)-X\max(n+1)=\Delta X\max(n+1)-\Delta X\max(n)=\{\sqrt{(3/4+2(n+1))}-\sqrt{(3/4+2n)}\}\cdot\sqrt{(\lambda \cdot r)} \quad \text{Equation 5}$$

When the CCD 122 and the pupil position of the projection optical system 30 are considered conjugate with each other, a distance between the aperture stop 32 and the pupil position of the projection optical system 30, or the distance r in FIG. 2, can be calculated. Similarly, the distance r between the aperture stop 32 and the pupil position can be also calculated from Equations 2 and 4.

Xmax(n) or Xmin(n) can be calculated from the distance r, and the true position X0 of the aperture stop 32, or the NA of the projection optical system 30 can be calculated from Equation 3 or 4.

A description will now be given of some methods of calculating the true position X0 of the aperture stop 32 or the distance r from the calculated position Xmax(n) or Xmin(n) of the aperture stop 32.

Xmax(0) and Xmin(0) are most intensified extreme values in the diffracted image. The true position X0 of the aperture stop 32 or the distance r can be calculated with these two values.

Equation 6 below is derived from Equations 1 to 4:

$$\frac{X\min(0)-X\max(0)=\Delta X\max(0)-\Delta X\min(0)=(\sqrt{7/4}-\sqrt{3/4})}{\sqrt{\lambda \cdot r}}$$

The distance r can be calculated from Equation 6. Similarly, the true position X0 of the aperture stop 32 can be calculated from Equation 3 or 4. This is true even when n is other than 0. By using the distance r as a fixed value, the true position X0 of the aperture stop 32 can be directly calculated from the calculated position Xmax(n) or Xmin(n) of the aperture stop 32. Of course, by using the calculated position Xmax(n) or Xmin(n) of the aperture stop 32 as a parameter, a variance amount of Xmax(n) or Xmin(n) may be monitored while the position of the aperture stop 32 is varied in the optical axis direction. This configuration can detect a position at which Xmax(n) or Xmin(n) has an extreme value. When the distance between the aperture stop 32 and the pupil position of the projection optical system 30 is nearly 0, the true position X0 of the aperture stop 32 can be calculated. This is because Xmax(n) or Xmin(n) is proportional to $\sqrt{r}$ in the Fresnel approximation region as indicated in Equation 1 or 2. As the distance r approaches 0, the position converges on a certain value as in the above rigorous solution. Therefore, when the distance r is a sufficiently small value, Xmax(n) or Xmin(n) does not change and the true position X0 of the aperture stop 32 can be directly calculated from the calculated position Xmax(n) or Xmin(n) of the aperture stop 32 by considering r to be 0 as described above.

Moreover, Xmax(θ, n) or Xmin(θ, n) is calculated from a curve relating to a radial position, which is formed by cutting the light intensity distribution map with a plane that passes the center of outline of the light intensity distribution map, and has an arbitrary direction θ. Then, r(0) and X0(θ) are calculated. The aperture stop 32's aperture shape and positional offset in the optical axis direction can be calculated by repeating the above operation with different θ.

Turning back to FIG. 4, it is determined whether the position of the aperture stop 32 is measured at all predetermined measurement positions in the optical axis direction of the projection optical system 30 (step 1006). If the position of the aperture stop 32 is not measured at all predetermined measurement positions, the measurement position of the aperture stop 32 is changed (step 1008) and the step 1002 and subsequent steps are repeated.

On the other hand, when the position of the aperture stop 32 is measured at all predetermined measurement positions in the optical axis direction of the projection optical system 30, a correction amount of the aperture stop 32 is calculated from the measured position of the aperture stop 32 and the measured NA of the projection optical system 30 (step 1010). For example, the calculated position of the aperture stop 32 and the calculated NA of the projection optical system 30 are compared with a target position of the aperture stop 32 and a target NA of the projection optical system 30. Then, a difference is set as a correction amount for the aperture stop 32.

Then, the size (aperture shape) and the position of the aperture of the aperture stop 32 are corrected or adjusted in accordance with the correction amount of the aperture stop 32 (step 1012).

Thus, the position of the aperture stop 32 can be precisely calculated by utilizing the diffraction fringe that contains the information of the edge of the aperture stop 32.

Second Embodiment

Figure 5:
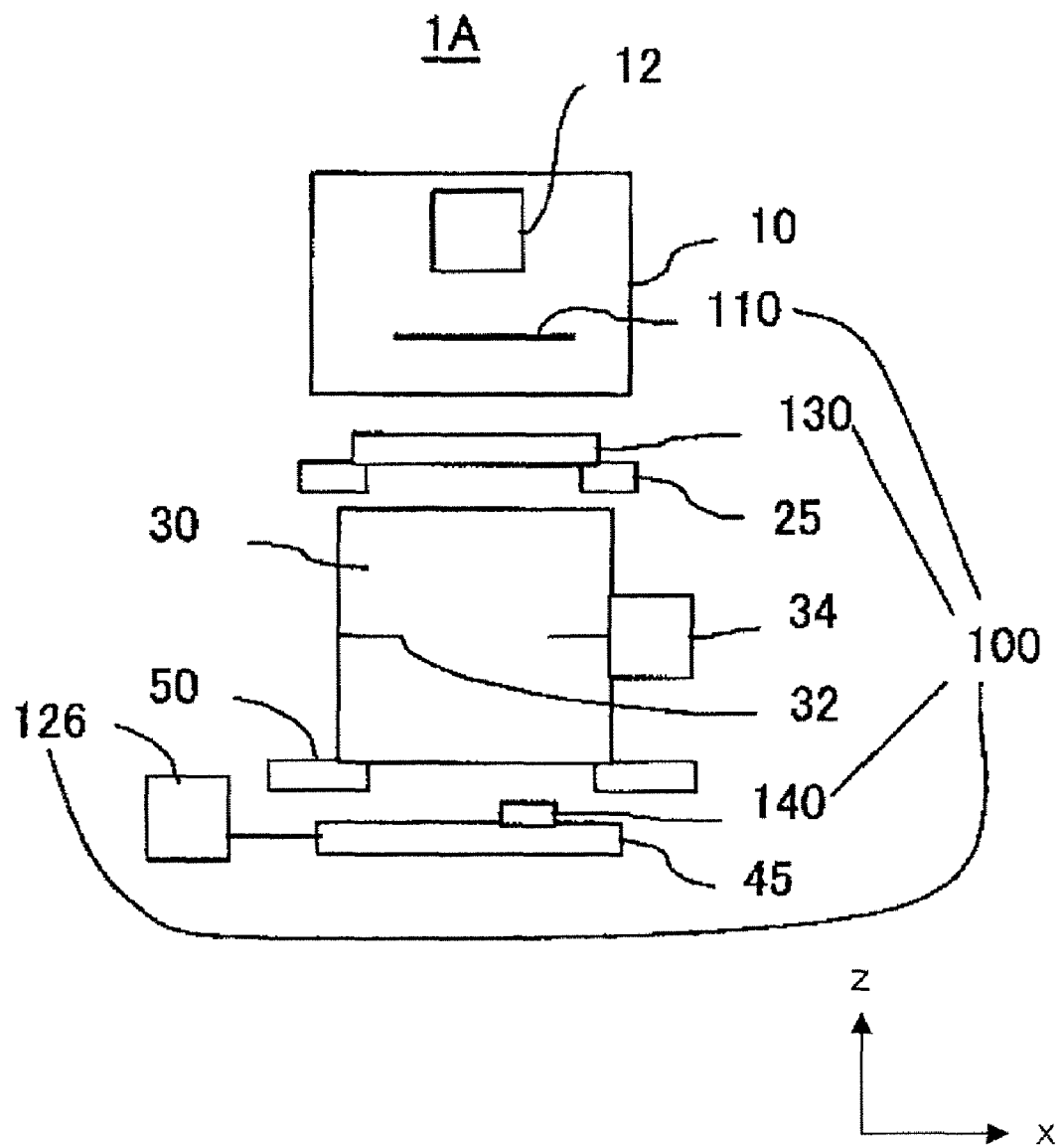
FIG. 5 is a schematic sectional view showing a structure of the exposure apparatus according to one aspect of the present invention.

FIG. 5 is a schematic sectional view showing a structure of an exposure apparatus 1A as a modification of the exposure apparatus 1. The exposure apparatus 1A is similar to the exposure apparatus 1 except the structure of the measurement unit 100. In comparison with the measurement unit 100 of the first embodiment, the measurement unit 100 of the second embodiment further includes a mask 130 and a measuring part 140 instead of the measuring part 120.

Figure 6:
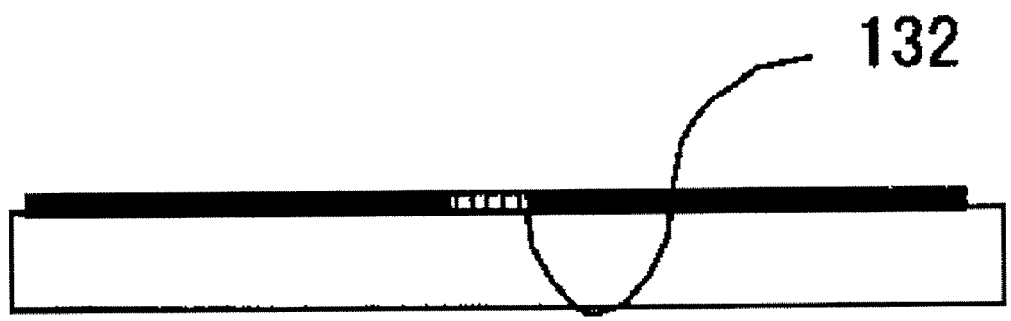
FIG. 6 is a schematic sectional view showing a structure of a mask shown in FIG. 5.
Figure 6:
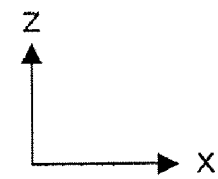

The mask 130 is located on the reticle stage 25, and is replaced with the reticle 20 on the optical path in measuring the position of the aperture stop 32 in the projection optical system 30. The mask 130 has an aperture on a surface opposite to the surface facing the object plane of the projection optical system 30, as shown in FIG. 6, and includes a diffusion optical element 132 above or in the aperture. The optical element 132 is slightly defocused from the object plane of the projection optical system 30. This embodiment forms a light transmitting part at the center of a light shielding part made of Cr. The diffusion optical element 132 is located inside the aperture part as the light transmitting part. The mask 130 has the diffusion optical element 132, and provides a similar effect to the aperture plate 112 that includes the optical element 112a having a diffusion effect. Therefore, one of the aperture plate 112 or mask 130 may be arranged. Here, FIG. 6 is a schematic sectional view showing a structure of the mask 130.

The mask 130 has an aperture or pinhole in the surface opposite to the surface facing the object plane of the projection optical system 30. Since the diffusion optical element 132 of the aperture part is slightly defocused from the object plane of the projection optical system 30, a position of the aperture stop 32 is measured at a far field position on the image plane of the projection optical system 30, which can be regarded as a position that is optically conjugate with the pupil position of the projection optical system 30. Hence, the light that has passed the mask 130 passes the aperture stop 32 in the projection optical system 30, and forms on the image plane of the projection optical system 30 the light intensity distribution of the pupil plane.

Figure 7:
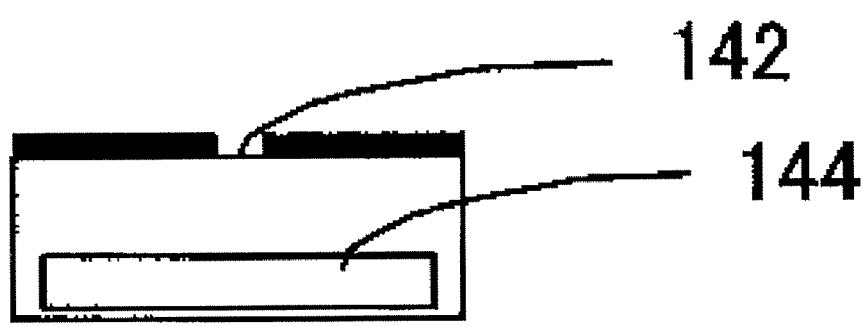
FIG. 7 is a schematic sectional view showing a structure of a measuring part shown in FIG. 5.
Figure 7:
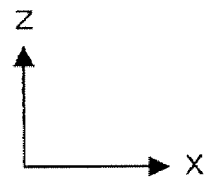

The measuring part 140 measures the light intensity distribution formed on the image plane of the projection optical system 30. The measuring part 140 includes, as shown in FIG. 7, an aperture plate 142, and a photo sensor 144 slightly apart from the aperture plate 142. The measuring part 140 is located on the wafer stage 45, moves the position of the aperture plate 142 to a position on the image plane of the projection optical system 30, and detects the light quantity that passes the aperture plate 142 with the photo sensor 144 while moving in the XY directions. Thereby, the measuring part 140 can measure the light intensity distribution of the light that has passed the aperture stop 32 in the projection optical system 30. Here, FIG. 7 is a schematic sectional view showing a structure of the measuring part 140.

Similar to the first embodiment, the controller 126 calculates the light intensity distribution map form the measured light intensity distribution, calculates positions that provide local maximum and minimum values from the light intensity distribution map, and analyzes the position of the aperture stop 32. Calculations of the NA of the projection optical system 30 and the position of the aperture stop 32 or the operations of the controller 126 are similar to those of the first embodiment.

Third Embodiment

Figure 8:
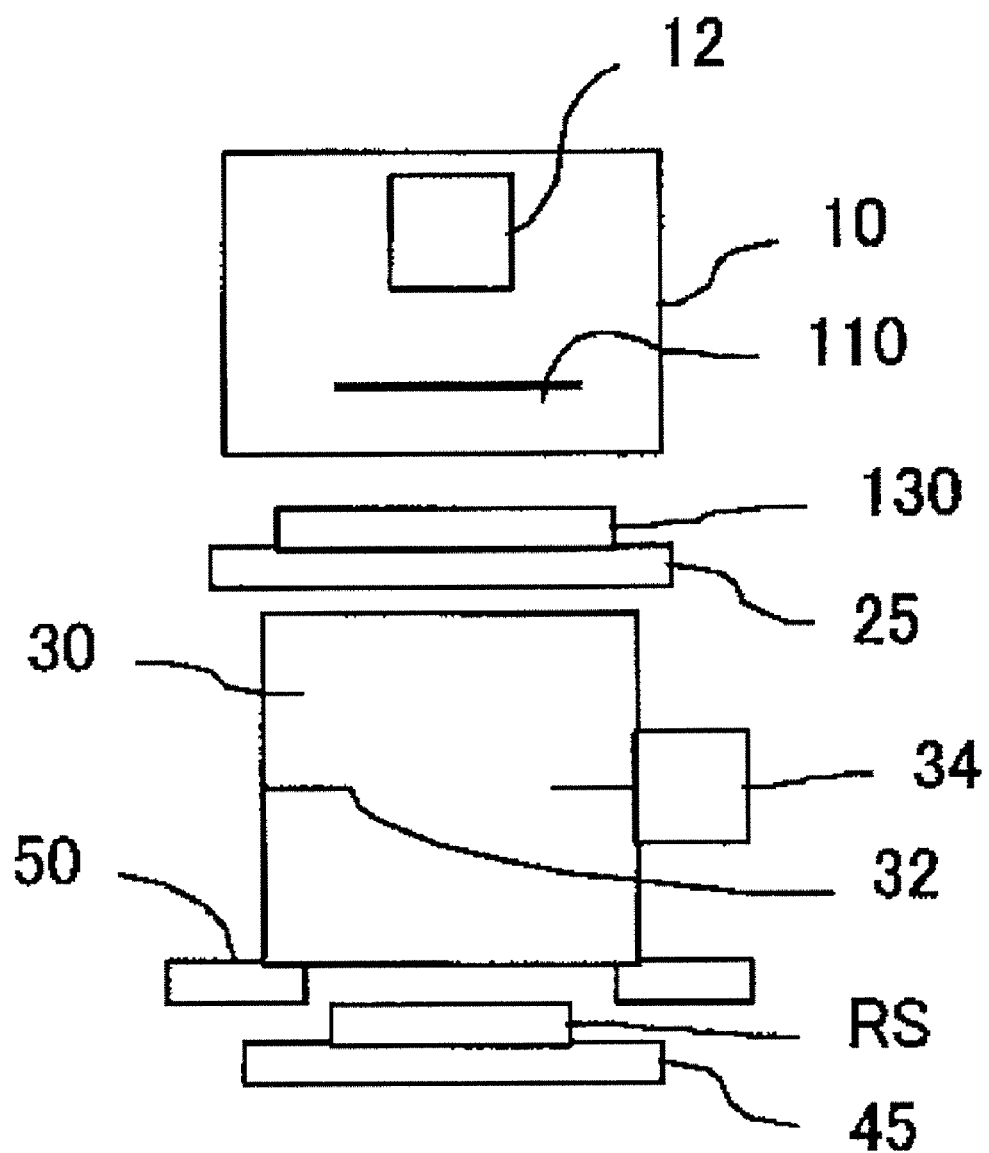
FIG. 8 is a schematic sectional view showing a structure of the exposure apparatus according to one aspect of the present invention.

FIG. 8 is a schematic sectional view showing a structure of an exposure apparatus 1B as a modification of the exposure apparatus 1. The exposure apparatus 1B is similar to the exposure apparatus 1 but further includes a mask 130. The exposure apparatus 1B does not require the measuring part 140, and measures the position of the aperture stop 32 in the projection optical system 30 based on the actual exposure result of a photosensitive substrate RS placed on the wafer stage 45. The photosensitive substrate RS may be the substrate 40.

The mask 130 is located on the reticle stage 25, similar to the second embodiment, and replaced with the reticle 20 on the optical path in measuring the position of the aperture stop 32 in the projection optical system 30. The structure of the mask 130 is similar to that of the second embodiment, and a detailed description thereof will be omitted.

Figure 9:
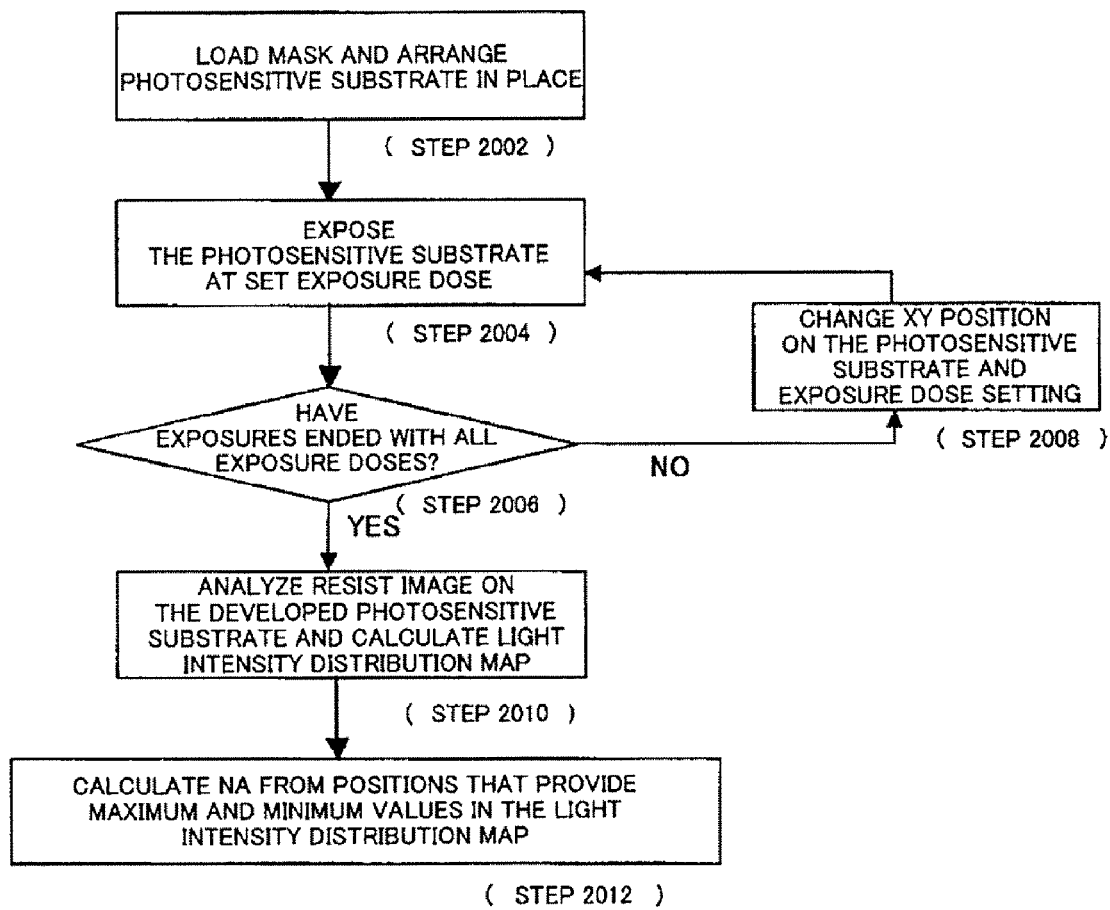
FIG. 9 is a flowchart for explaining an exposure method according to one aspect of the present invention.

Referring now to FIG. 9, a description will be given of an exposure method with the exposure apparatus 1B. Here, FIG. 9 is a flowchart for explaining an exposure method according to one aspect of the present invention.

Initially, the mask 130 and the photosensitive substrate RS are arranged in place (step 2002). The focus measuring system 50 measures a position of the photosensitive substrate RS in the Z or optical axis direction, and the wafer stage 45 moves the substrate RS to the image plane position of the projection optical system 30.

After the mask 130 and the photosensitive substrate RS are arranged in place, the photosensitive substrate RS is exposed at a set exposure dose (step 2004). The light that has passed the mask 130 and the aperture stop 32 forms, on the image plane of the projection optical system 30, a light intensity distribution on the pupil plane of the projection optical system 30. Thus, the light intensity distribution of the pupil plane in the projection optical system 30 is formed on the photosensitive substrate RS. Then, it is determined whether the photosensitive substrate RS is exposed at all predetermined exposure doses (step 2006).

When the photosensitive substrate RS is not exposed at all predetermined exposure doses, the XY position of the photosensitive substrate RS is moved and the exposure dose is changed (for example, by adding ΔE to the exposure dose) (step 2008), and the procedure returns to the step 2004. Thereby, the light intensity distribution is formed at the different exposure dose on the photosensitive substrate RS.

Figure 12:
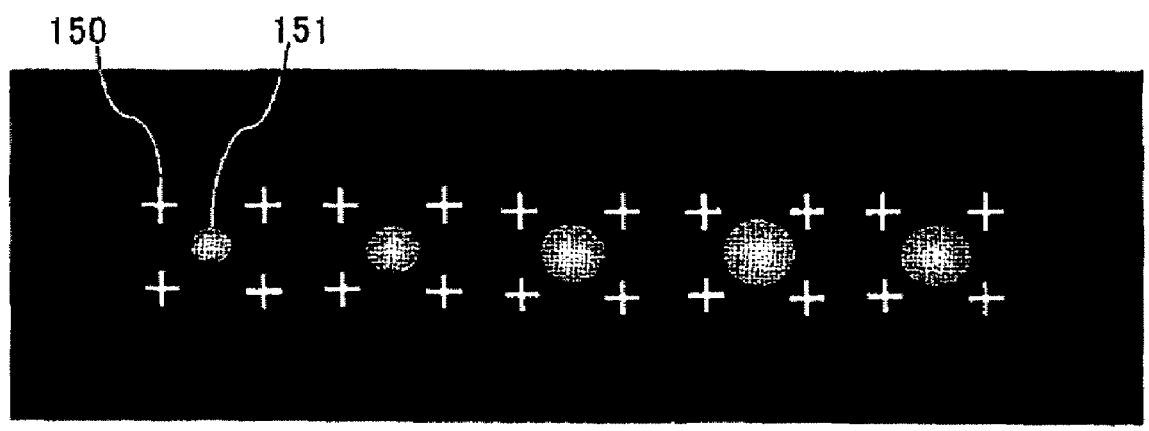
FIG. 12 is a schematic diagram showing a pattern formed on a photosensitive substrate.

On the other hand, when the photosensitive substrate RS is exposed at all predetermined exposure doses, the exposed photosensitive substrate RS is developed and the resist image is analyzed so as to calculate the light intensity distribution map (step 2010). More specifically, after the photosensitive substrate RS is developed, the light intensity distribution at a different exposure dose is observed with an optical microscope. The image analysis provides a three-dimensional light intensity distribution map. In the step 2004, as shown in FIG. 12, a reference pattern 150 may be formed around the exposed and measured pattern 151 through double exposures. In the exposure step 2004, reference marks 150 may be exposed through double exposure for each of the measured patterns 151 having plural different exposure doses. In the light intensity distribution map forming step 2010, a position of each measured pattern 151 can be conveniently recognized based on the corresponding reference mark 150. Here, FIG. 12 is a schematic view showing a pattern formed on the photosensitive substrate RS.

Next, similar to the first embodiment, the NA of the projection optical system 30 (or the position and the aperture size of the aperture stop 32) is calculated from the positions that provide local maximum and minimum values in the light intensity distribution map (step 2012). The aperture size (aperture shape) and position of the aperture stop 32 are corrected based on the calculated NA of the projection optical system 30. Moreover, the mask 130 is replaced with the reticle 20, and the photosensitive substrate RS is replaced with the substrate 40 so as to expose the pattern of the reticle 20 onto the substrate 40.

Thus, the exposure apparatuses 1 to 1B can precisely measure the NA of the projection optical system 30 (aperture stop 32's aperture shape and position), and can precisely adjust the NA of the projection optical system 30. The above measurement method and apparatus (measurement unit 100) for measuring the position of the aperture stop 32 in projection optical system 30 constitute one aspect of the present invention.

In exposure, the light is emitted from the light source 12 illuminates the reticle 20 via the illumination optical system (not shown). The light that has passed the reticle 20, and reflects the reticle pattern is imaged on the substrate 40 via the projection optical system 30. The projection optical system 30 used for the exposure apparatus 1 has the aperture stop 32 that has a highly precisely controlled aperture shape and position. Thereby, the exposure apparatuses 1 to 1B can achieve the superior exposure characteristic (high resolution), and provide a higher quality device, such as a semiconductor device and a liquid crystal display device, than ever.

Figure 10:
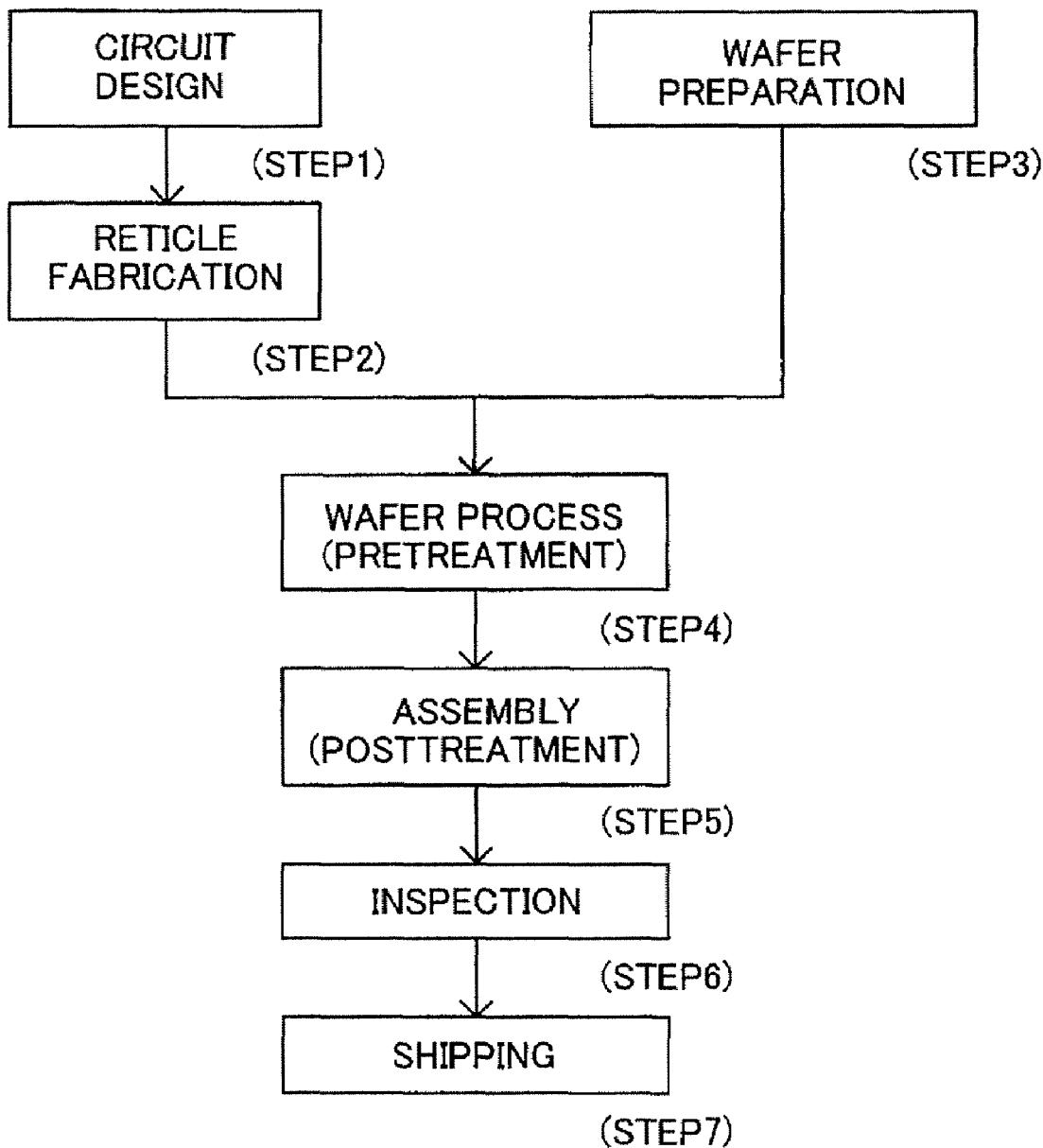
FIG. 10 is a flowchart for explaining a fabrication of a device (a semiconductor device and a liquid crystal display device).
Figure 11:
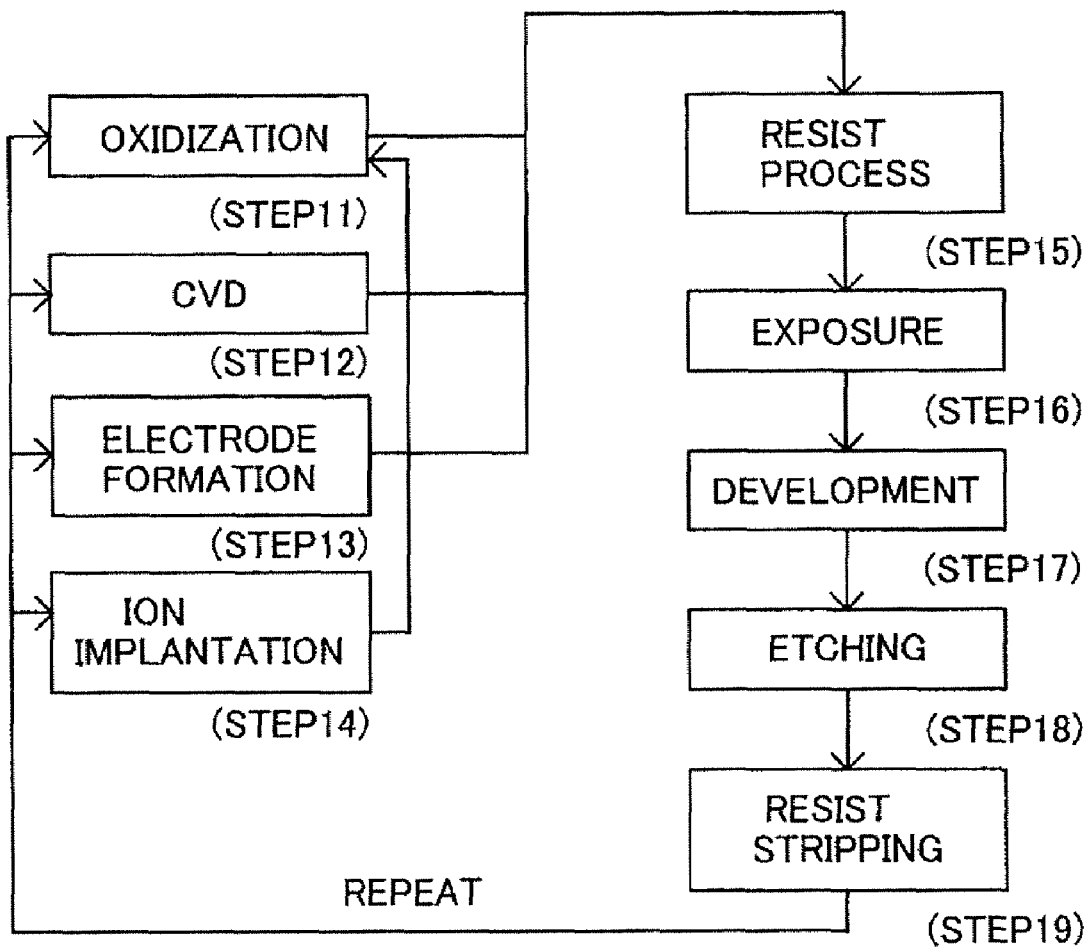
FIG. 11 is a flowchart for a wafer process of step 4 shown in FIG. 10.

Referring now to FIGS. 10 and 11, a description will be given of an embodiment of a device manufacturing method using the exposure apparatus 1, 1A or 1B. FIG. 10 is a flowchart for explaining manufacture of devices, such as a semiconductor device and a liquid crystal display device. Here, a description will be given of the fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1, 1A or 1B to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the device manufacturing method using the exposure apparatus 1, 1A or 1B, and a resultant device also constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims a foreign priority benefit based on Japanese Patent Applications Nos. 2006-096053, filed on Mar. 30, 2006 and 2007-086006, filed on Mar. 28, 2007, and each of which is hereby incorporated by reference herein in its entirety as if fully set forth herein.

What is claimed is:

1. A measurement method for measuring a position of an aperture stop in an optical system, said measurement method comprising the steps of:

measuring a light intensity distribution of light that passes the aperture stop, at a position that is optically conjugate with a pupil position in the optical system; and determining a position of the aperture stop in the optical system based on a diffraction fringe of the light intensity distribution measured by the measuring step.

2. A measurement method according to claim 1, wherein the determining step includes the steps of:

calculating an integral curve relative to a radial direction of the aperture stop based on a rotational integration from a center of outline of the light intensity distribution;

calculating one or more extreme values in the integral curve; and calculating a numerical aperture of the aperture stop based on the one or more extreme values.

3. A measurement method according to claim 1, wherein the determining step includes the steps of:

calculating an integral curve relative to a radial direction of the aperture stop based on a rotational integration from a center of outline of the light intensity distribution;

calculating one or more extreme values in the integral curve from each of plural section curves that pass the center of outline of the light intensity distribution; and calculating a shape of the aperture stop based on the one or more extreme values.

4. A measurement method according to claim 1, wherein the determining step calculates a positional offset of the aperture stop in an optical axis direction.

5. A measurement method according to claim 1, wherein the determining step includes the steps of:

calculating an integral curve relative to a radial direction of the aperture stop based on a rotational integration from a center of outline of the light intensity distribution;

calculating at least one local maximum or minimum value from a leading edge of the integral curve to an n-th leading or trailing edge where n is an integer of 0 or greater; and calculating a position of the aperture stop in a radial direction or a positional offset of the aperture stop in an optical axis direction based on the at least one local maximum or minimum value.

6. A measurement apparatus for measuring a position of an aperture stop in an optical system, said measurement apparatus comprising:

a measurement unit arranged at a position that is optically conjugate with a pupil position in the optical system, the measurement unit measuring a light intensity distribution of light that has passed the aperture stop; and a controller for controlling the position of the aperture stop in the optical system based on a diffraction fringe of the light intensity distribution measured by the measurement unit.

7. A measurement apparatus according to claim 6, further comprising a mask that has an aperture part that transmits the light, and a diffusion part that diffuses the light, the mask being located at a position that is optically conjugate with an object plane of the optical system.

8. An exposure apparatus comprising:

a projection optical system for projecting a pattern of a reticle onto a substrate;

a mask that has an aperture part that transmits the light, and a diffusion part that diffuses the light, the mask being located at a position that is substantially optically conjugate with an object plane of the projection optical system;

a measurement unit arranged at a position that is optically conjugate with a pupil position in the projection optical system, the measurement unit measuring a light intensity distribution of light that has passed the aperture stop; and a controller for controlling a position of the aperture stop in the projection optical system based on a diffraction fringe of the light intensity distribution measured by the measurement unit.

9. An exposure method for exposing a pattern of a reticle onto a substrate via a projection optical system, said exposure method comprising the steps of:

exposing a mask pattern of a mask onto a substrate at plural different exposure doses, the mask having an aperture part that transmits the light, and a diffusion part that diffuses the light, the mask being located at or near a position optically conjugate with an object plane of the projection optical system, and apart from an image plane of the projection optical system; and determining a position of the aperture stop in the projection optical system based on the mask pattern exposed on the substrate.

10. An adjusting method comprising the steps of:

measuring a position of an aperture stop in an optical system using a measurement method according to claim 1; and adjusting the aperture stop in the optical system based on a measurement result of the measuring step.

11. An adjusting method comprising the steps of:

measuring a position of an aperture stop in an optical system using a measurement apparatus according to claim 6; and adjusting the aperture stop in the optical system based on a measurement result of the measuring step.

* * * * *